United States Patent [19]
Katoh

[11] Patent Number: 6,088,311
[45] Date of Patent: Jul. 11, 2000

[54] OPTICAL DISC DEVICE

[75] Inventor: Hisao Katoh, Tokyo, Japan

[73] Assignee: Mitsubishi Denki Kabushiki Kaisha, Tokyo, Japan

[21] Appl. No.: 09/004,667

[22] Filed: Jan. 9, 1998

[30] Foreign Application Priority Data

Aug. 28, 1997 [JP] Japan ................................. 9-232613

[51] Int. Cl.[7] ...................................................... G11B 5/09
[52] U.S. Cl. ................................................. 369/47; 369/48
[58] Field of Search ................................. 369/32, 47, 48, 369/49, 54, 58, 59, 50, 124; 360/26, 27, 51

[56] References Cited

U.S. PATENT DOCUMENTS 5,469,417  11/1995  Tanoue et al. ...................... 369/47 X

FOREIGN PATENT DOCUMENTS 6150569  5/1994  Japan .
7-93911  4/1995  Japan .

Primary Examiner—Paul W. Huber
Attorney, Agent, or Firm—Leydig, Voit & Meyer, Ltd.

[57] ABSTRACT

An optical disc device is provided with a channel phase-locked loop (channel PLL) for generating a read clock signal and a wobble phase-locked loop (wobble PLL) for generating a write clock signal. A frequency divider divides the frequency of the write clock signal from the wobble PLL by a predetermined number n so as to generate a pseudo channel data. A selector selects the pseudo channel data and then furnishes the selected pseudo channel data to the channel PLL when the optical disc device handles a not-yet-recorded area between two adjacent header areas on an optical disc where no data is recorded. The channel PLL locks itself with the pseudo channel data from the selector.

10 Claims, 8 Drawing Sheets

OPTICAL DISC DEVICE

BACKGROUND OF THE INVENTION

1. Field of the Invention

The present invention relates to an optical disc device which can read binary data, which will be referred to as header data, in a header area on a optical disc, such as a mini disc or MD or a compact disc-recordable or CD-R, in which a sector address or the like is pre-recorded, using light, and then write the data on a recording area of the optical disc. More particularly, the present invention relates to an optical disc device which can generate a clock in synchronism with binary channel data recorded between two adjacent header areas on an optical disc and then read the channel data at a high speed.

2. Description of the Prior Art

Referring now to FIG. 7, there is illustrated a block diagram showing the structure of a prior art optical disc device. In the figure, reference numeral 1 denotes a channel phase-locked loop or channel PLL which can generate a read clock signal RCK from channel data D1, which is channel data or a header data read out of an optical disc (not shown) such as an MD or CD-R; and 2 denotes a wobble phase-locked loop or wobble PLL, which can generate a write clock signal WCK from a wobble signal S1 detected from a wobbly groove in each track wobbling at predetermined intervals, which is formed on the optical disc.

Reference numeral 5 denotes a phase comparator which can compare the phase of the channel data D1 with that of the read clock signal RCK and then furnish a phase error signal representing the phase displacement between the channel data D1 and the read clock signal RCK; 6 denotes a frequency comparator which can compare the frequency of the channel data D1 with that of the read clock signal RCK and then furnish a frequency error signal representing the frequency displacement between the channel data D1 and the read clock signal RCK; 7 denotes a charge pump which can increase the voltage of the phase error signal from the phase comparator 5 to a predetermined voltage so as to convert the phase error signal into a first current having an amplitude corresponding to the phase displacement between the channel data D1 and the read clock signal RCK; and 8 denotes another charge pump which can increase the voltage of the frequency error signal from the frequency comparator 6 to a predetermined voltage so as to convert the frequency error signal into a second current having an amplitude corresponding to the frequency displacement between the channel data D1 and the read clock signal RCK.

Reference numeral 9 denotes an adder which can obtain the sum of the first current representing the phase displacement from the charge pump 7 and the second current representing the frequency displacement from the charge pump 8; 10 denotes a low-pass filter which can generate an error voltage and furnish the error voltage as a control voltage by attenuating unnecessary high-frequency components of the summation result or the summation error signal furnished by the adder 9; and 11 denotes a voltage controlled oscillator or VCO which can generate a read clock signal RCK having a frequency corresponding to the control voltage furnished by the low-pass filter 10.

Reference numeral 15 denotes a frequency comparator which can compare the frequency of the wobble signal S1 with that of the output signal of a 1/186 frequency divisor 19 and then furnish a frequency error signal representing the frequency displacement between the wobble signal S1 and the output signal from the frequency divisor 19; and 16 denotes a charge pump which can increase the voltage of the frequency error signal from the frequency comparator 15 to a predetermined voltage so as to convert the frequency error signal into a current having an amplitude corresponding to the frequency displacement between the wobble signal S1 and the output signal of the frequency divisor 19.

Reference numeral 17 denotes a low-pass filter which can generate an error voltage and then furnish the error voltage as a control voltage by attenuating unnecessary high-frequency components of the frequency error signal furnished by the charge pump 16; and 18 denotes a voltage controlled oscillator which can generate a write clock signal WCK having a frequency corresponding to the control voltage furnished by the low-pass filter 17. The 1/186 frequency divider 19 divides the frequency of the write clock signal WCK furnished by the voltage controlled oscillator 18 by a given number 186 so as to generate and furnish a feedback signal having the same frequency as the wobble signal S1 to the frequency comparator 15.

In operation, the optical disc device reads channel data from an optical disc and then writes the channel data in a recording area on the optical disc. Since header data pre-recorded and channel data written into a recording area on an optical disc was recorded by different recording devices, respectively, header data and channel data which can be read out from an optical disc upon reproduction of the channel data are discrete and are out of phase with respect to each other.

When reproducing data recorded on an optical disc, it is necessary to quickly generate a clock signal in synchronism with header and channel data which are discrete and are out of phase with respect to each other, and furnish the clock signal to a signal processing circuit located at the next stage. When the optical disc device handles a not-yet-recorded area where no data is pre-recorded, a synchronous clock signal generated can become a free-running state, resulting in an off-track error. As a result, the frequency of the clock signal will be displaced with respect to a header data which is to be processed next, and therefore it takes a long time to generate a synchronous clock signal for reading the next header data and a channel data in a recording area located behind the header data.

FIG. 8 shows the wave form of the control voltage applied to the VCO 11 when the optical disc device handles a not-yet-recorded area 25. In order to prevent a large displacement of the frequency of the clock signal, the output of the channel PLL 1 can be repeatedly held in synchronism with a plurality of data in header areas 26, 27, 28, and 29 which are intermittently applied to the channel PLL 1, while the optical disc device handles the not-yet-recorded area 25 as shown in FIG. 8, for example.

The frequency of the read lock signal RCK can be controlled to reproduce data properly in the following manner. In FIG. 8, it is assumed that at time t0 the control voltage has an initial value V0 which differs from a locked voltage V1. If the control voltage reaches the locked voltage V1, the channel PLL 1 can be locked so as to furnish a read clock signal RCK having a frequency suitable for reproducing data properly.

When a control operation on the channel PLL 1 is started at time t0 in order to increase the control voltage having the initial value V0 to the locked voltage V1, data stored in the first header area 26 is applied as the channel data D1 to the phase and frequency comparators 5 and 6 of the channel PLL 1. The phase comparator 5 then compares the phase of the channel data D1 with that of the read clock signal RCK which is being furnished by the channel PLL 1 at that time. The phase comparator 5 furnishes a phase error signal representing the phase displacement between the channel data D1 and the read clock signal RCK to the charge pump 7. Simultaneously, the frequency comparator 6 compares the frequency of the channel data D1 with that of the read clock signal RCK. The frequency comparator 6 then furnishes a frequency error signal representing the frequency displacement between the channel data D1 and the read clock signal RCK to the charge pump 8. The charge pump 7 increases the voltage of the phase error signal from the phase comparator 5 to a predetermined voltage so as to convert the phase error signal into a current having an amplitude corresponding to the phase displacement between the channel data D1 and the read clock signal RCK and then deliver the current to the adder 9. The charge pump 8 increases the voltage of the frequency error signal from the frequency comparator 6 to a predetermined voltage so as to convert the frequency error 6 signal into a current having an amplitude corresponding to the frequency displacement between the channel data D1 and the read clock signal RCK and then deliver the current to the adder 9. The adder 9 obtains the sum of both the currents from the charge pumps 7 and 8 and then delivers to the summation result to the low-pass filter 10 as the summation error signal. The low-pass filter 10 generates an error voltage as a control signal to the VCO 11 by attenuating unnecessary high-frequency components of the summation error signal from the adder 9. The VCO 11 then generates a read clock signal RCK having a frequency corresponding to the control voltage from the low-pass filter 10. The read clock signal RCK is also fed back into both the phase and frequency comparators 5 and 6 as a feedback signal.

In the feedback loop, while data recorded in the header area 26 shown in FIG. 8 is input to the channel PLL 1 as the data D1, the control voltage applied to the VCO 11 increases as indicated by reference numeral 31 in FIG. 8. Furthermore, when the optical disc device passes through the header area 26 and then reaches an area between the header areas 26 and 27 where no data is recorded, the channel PLL 1 leaves the control voltage unchanged so that the control voltage has a value V01 that it reached at the time just before the optical disc device has passed through the header area 26, and therefore the channel PLL 1 becomes a holding state in which it maintains its output. The read clock signal RCK consequently has a phase and a frequency corresponding to the control voltage V01 which is locked as mentioned above.

After that, the control voltage increases similarly when the optical disc device reaches the next header area 27, and the control voltage is held at a voltage of V02 just after the optical disc device has passed through the header area 27. Furthermore, the control voltage increases similarly when the optical disc device reaches the next header area 28, and the control voltage is held at a locked voltage of V1 just after the optical disc device has passed through the header area 28. As a result, the read clock signal RCK has a phase and a frequency corresponding to the control voltage held at the locked voltage V1. The optical disc device thus can start to read data recorded in the header area 29 at time t2 when the optical disc device reaches the header area 29, and start to reproduce data recorded in a data recording area 32 located just behind the header area 29 at time t3 when the optical disc device reaches the recording area 32.

On the other hand, the wobble PLL 2, which is disposed separately from the channel PLL 1, can generate a write clock signal WCK having the same phase and frequency as the read clock signal RCK by multiplying the frequency of the wobble signal S1 applied to the wobble PLL 2. The frequency comparator 15 compares the frequency of the wobble signal SI with that of the feedback signal, i.e., the output signal of the 1/186 frequency divider 19. The frequency comparator 15 then furnishes a frequency error signal representing the frequency displacement between the wobble signal S1 and the output signal of the 1/186 frequency divider 19 to the charge pump 16. The charge pump 16 increases the voltage of the frequency error signal from the frequency comparator 15 to a predetermined voltage so as to convert the frequency error signal into a current having an amplitude corresponding to the frequency displacement between the wobble signal S1 and the output signal of the 1/186 frequency divider 19 and then deliver the current to the low-pass filter 17. The low-pass filter 17 generates an error voltage and furnishes the error voltage as a control voltage to the VCO 18 by attenuating unnecessary high-frequency components of the frequency error signal furnished by the charge pump 16. The VCO 18 then generates a write clock signal WCK having a frequency corresponding to the control voltage from the low-pass filter 17. The write clock signal WCK is also fed back as the feedback signal into the frequency comparator 16 after the frequency of the write clock signal WCK is divided by the 1/186 frequency divider 19 by 186 so that the feedback signal into the frequency comparator 15 has the same frequency as the wobble signal S1.

Such a prior art optical disc device which is so constructed has a few disadvantages. The first disadvantage is that since a control operation is performed on the channel PLL 1 only if data read out of each header area is intermittently applied to the channel PLL 1 when the optical disc device handles a not-yet-recorded area on an optical disc, it takes a long time to bring the optical disc device to a state in which it can read header data or channel data by locking the channel PLL 1.

In order to cause the channel PLL 1 to lock itself for header data in a not-yet-recorded area as soon as possible, the frequency of the output of the VCO of the channel PLL 1 that can be controlled has to be limited in a narrow range of adjustment. A second disadvantage is thus that if the frequency range of adjustment is limited, the access time is delayed for an optical disc which can rotate at only a rpm that can be locked and in which data are pre-recorded by means of a servo having a constant linear velocity (CLV), such as a CD-ROM, or a DVD-ROM.

SUMMARY OF THE INVENTION

The present invention is made to overcome the above disadvantages. It is therefore an object of the present invention to provide an optical disc device which can reduce the time required for bringing itself to a state in which it can read header data or channel data by quickly locking a channel PLL disposed within the optical disc device when the optical disc device handles a not-yet-recorded area on an optical disc where no data is recorded.

In accordance with one aspect of the present invention, there is provided an optical disc device which can read and write data from and on an optical disc using light, comprising: a first selector for selecting, as input data, header data recorded in a header area on the optical disc or channel data recorded in a data recording area between two adjacent header areas on the optical disc when the optical disc device handles the header area or the data recording area, and for selecting a pseudo input data when the optical disc device handles a not-yet-recorded area between two adjacent header areas on the optical disc where no data is recorded;

a channel phase-locked loop for generating a phase error signal representing a phase displacement between the input data or the pseudo input data selected by the first selector and a feedback signal, and a frequency error signal representing a frequency displacement between the input data or the pseudo input data selected by the first selector and the feedback signal, for increasing the sum of the voltages of the phase and frequency error signals so as to generate a read clock signal having a frequency corresponding to the increased voltages for reading data from the optical disc, and for feeding back the read clock signal as the feedback signal for the generation of the phase and frequency error signals; a wobble phase-locked loop for generating a phase error signal representing a phase displacement between a wobble signal obtained from the optical disc and a feedback signal, for increasing the voltage of the phase error signal so as to generate a write clock signal having a frequency corresponding to the multiplied voltage for writing data on the optical disc, and for dividing the frequency of the write clock signal so as to generate and feed back the feedback signal having the same frequency as the wobble signal for the generation of the phase error signal; and a first frequency divider for dividing the frequency of the write clock signal from the wobble phase-locked loop by a predetermined number n so as to generate and furnish the pseudo input data to the first selector.

Preferably, the optical disc device further comprises a second frequency divider for dividing the frequency of a signal from a crystal oscillator so as to generate a pseudo wobble signal having the same frequency as the wobble signal, and a second selector for selecting and furnishing the pseudo wobble signal from the second frequency divider to the wobble phase-locked loop when the wobble signal cannot be applied to the optical disc device. The second selector can select and furnish the pseudo wobble signal from the second frequency divider to the wobble phase-locked loop in response to a control signal indicating that something is wrong with tracking of the optical disc.

In accordance with a preferred embodiment, the first frequency divider divides the frequency of the write clock signal from the wobble phase-locked loop by the predetermined number n so as to generate the pseudo input data having a frequency that is almost equal to an average frequency of the input data.

In accordance with another preferred embodiment, the first frequency divider divides the frequency of the write clock signal from the wobble phase-locked loop by the predetermined number n so as to generate the pseudo input data having a frequency showing a regularity which is nearly the same as that shown by the frequency of channel data that varies with time.

In accordance with another aspect of the present invention, there is provided an optical disc device which can read data from an optical disc using light, comprising: a first selector for selecting, as input data, header data stored in a header area on the optical disc or channel data stored in a data recording area between two adjacent header areas on the optical disc when the optical disc device handles the header area or the data recording area, and for selecting a pseudo input data when the optical disc device handles a not-yet-recorded area between two adjacent header areas on the optical disc where no data is recorded; a channel phase-locked loop for generating a phase error signal representing a phase displacement between the input data or the pseudo input data selected by the first selector and a feedback signal, and a frequency error signal representing a frequency displacement between the input data or the pseudo input data selected by the first selector and the feedback signal, for increasing the sum of the voltages of the phase and frequency error signals to a first error voltage so as to generate a read clock signal having a frequency corresponding to the first error voltage for reading data from the optical disc when the optical disc device handles the header area or the data recording area, and generate a read clock signal having a frequency corresponding to the voltage of a second error voltage applied thereto when the optical disc device handles the not-yet-recorded area, and for feeding back the read clock signal as the feedback signal for the generation of the phase and frequency error signals; a wobble phase-locked loop for generating a phase error signal representing a phase displacement between a wobble signal obtained from the optical disc and a feedback signal, for increasing the voltage of the phase error signal so as to generate and furnish the second error voltage to the channel phase-locked loop only if the optical disc device handles the header area or the data recording area, and for dividing the frequency of the read clock signal from the channel phase-locked loop so as to generate and feed back the feedback signal having the same frequency as the wobble signal for the generation of the phase error signal; and a first frequency divider for dividing the frequency of the read clock signal from the channel phase-locked loop by a predetermined number n so as to generate and furnish the pseudo input data to the first selector.

Preferably, the optical disc device further comprises a second frequency divider for dividing the frequency of a signal from a crystal oscillator so as to generate a pseudo wobble signal having the same frequency as the wobble signal, and a second selector for selecting and furnishing the pseudo wobble signal from the second frequency divider to the wobble phase-locked loop when the wobble signal cannot be applied to the optical disc device. The second selector can select and furnish the pseudo wobble signal from the second frequency divider to the wobble phase-locked loop in response to a control signal indicating that something is wrong with tracking of the optical disc.

In accordance with a preferred embodiment, the first frequency divider divides the frequency of the read clock signal from the channel phase-locked loop by the predetermined number n so as to generate the pseudo input data having a frequency that is almost equal to an average frequency of the input data.

In accordance with another preferred embodiment, the first frequency divider divides the frequency of the read clock signal from the channel phase-locked loop by the predetermined number n so as to generate the pseudo input data having a frequency showing a regularity which is nearly the same as that shown by the frequency of channel data that varies with time.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
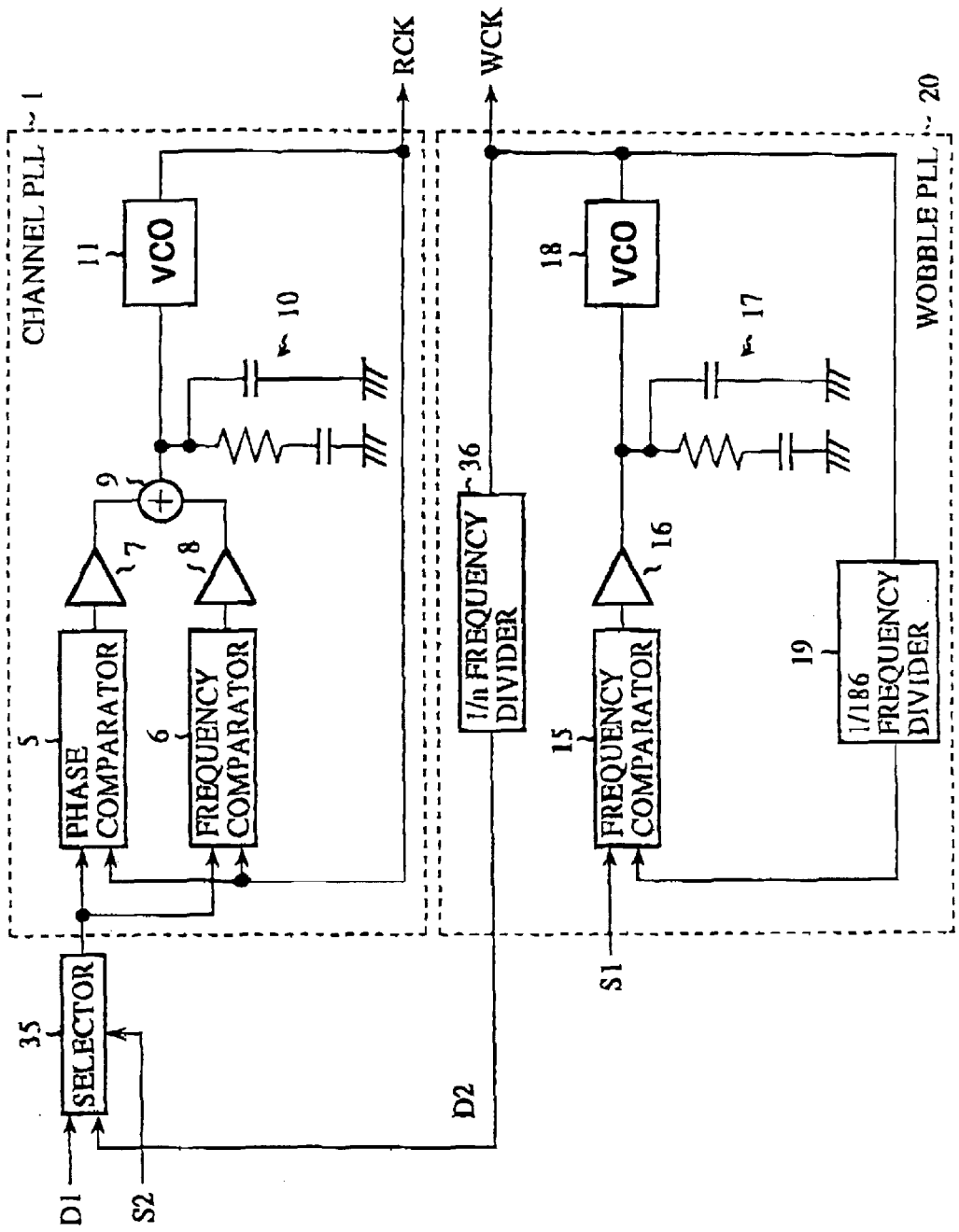
FIG. 1 is a block diagram showing the structure of an optical disc device according to a first embodiment of the present invention.

Referring next to FIG. 1, there is illustrated a block diagram showing the structure of an optical disc device according to a first embodiment of the present invention. In the figure, reference numeral 1 denotes a channel phase-locked loop (PLL) which can generate a read clock signal RCK from either a channel data D1, which is a channel data or a header data read out of an optical disc (not shown) such as an MD or a CD-R, or a pseudo channel data D2 from a wobble PLL 20 having the same frequency as the channel data D1. The wobble PLL 20 of the first embodiment can generate a write clock signal WCK from a wobble signal S1 detected from a wobbly groove in each track wobbling at predetermined intervals, which is formed on the optical disc.

Reference numeral 35 denotes a selector which can select and furnish either the channel data D1 or the pseudo channel data D2 from the wobble PLL 20 to a phase comparator 5 and a frequency comparator 6 of the channel PLL 1, according to the level of a control signal S2 applied thereto. When the optical disc device handles a header area in a not-yet-recorded area, the level of the control signal S2 goes low. When the optical disc device handles another area other than header areas in a not-yet-recorded area, the level of the control signal S2 goes high. When the control signal S2 at a low logic level is applied to the selector 35, the selector 35 selects and furnishes the channel data D1 to the phase and frequency comparators 5 and 6. When the control signal S2 at a high logic level is applied to the selector 35, the selector 35 selects and furnishes the pseudo channel data D2 to the phase and frequency comparators 5 and 6.

The phase comparator 5 compares the phase of the channel data D1 or the pseudo channel data D2 with that of a feedback signal, i.e., the read clock signal RCK and then furnishes a phase error signal representing the phase displacement between the channel data D1 or the pseudo channel data D2 and the read clock signal RCK. The frequency comparator 6 compares the frequency of the channel data D1 or the pseudo channel data D2 with that of the read clock signal RCK and then furnishes a frequency error signal representing the frequency displacement between the channel data D1 or the pseudo channel data D2 and the read clock signal RCK. Furthermore, reference numeral 7 denotes a charge pump which can increase the voltage of the phase error signal from the phase comparator 5 to a predetermined voltage so as to convert the phase error signal into a first current having an amplitude corresponding to the phase displacement between the channel data D1 or the pseudo channel data D2 and the read clock signal RCK; and 8 denotes another charge pump which can increase the voltage of the frequency error signal from the frequency comparator 6 to a predetermined voltage so as to convert the frequency error signal into a second current having an amplitude corresponding to the frequency displacement between the channel data D1 or the pseudo channel data D2 and the read clock signal RCK.

Reference numeral 9 denotes an adder which can obtain the sum of the first current representing the phase displacement from the charge pump 7 and the second current representing the frequency displacement from the charge pump 8; 10 denotes a low-pass filter which can generate an error voltage and then furnish the error voltage as a control voltage by attenuating unnecessary high-frequency components of the summation error signal furnished by the adder 9; and 11 denotes a voltage controlled oscillator which can generate a read clock signal RCK having a frequency corresponding to the control voltage furnished by the low-pass filter 10.

Reference numeral 15 denotes a frequency comparator which can compare the frequency of the wobble signal S1 with that of a feedback signal, i.e, the output of a 1/186 frequency divider 19 and then furnish a frequency error signal representing the frequency displacement between the wobble signal S1 and the output signal from the 1/186 frequency divider 19; and 16 denotes a charge pump which can increase the voltage of the frequency error signal from the frequency comparator 15 to a predetermined voltage so as to convert the frequency error signal into a current having an amplitude corresponding to the frequency displacement between the wobble signal S1 and the feedback signal from the 1/186 frequency divider 19.

Reference numeral 17 denotes a low-pass filter which can generate an error voltage and then furnish the error voltage as a control voltage by attenuating unnecessary high-frequency components of the frequency error signal furnished by the charge pump 16; and 18 denotes a voltage controlled oscillator which can generate a write clock signal WCK having a frequency corresponding to the control voltage furnished by the low-pass filter 17. The 1/186 frequency divider 19 divides the frequency of the write clock signal WCK furnished by the voltage controlled oscillator 18 by 186 so as to generate and furnish the feedback signal having the same frequency as the wobble signal S1 to the frequency comparator 15. Furthermore, reference numeral 36 denotes a 1/n frequency divider which can divide the frequency of the write clock signal WCK by n so as to generate and furnish the pseudo channel data D2 to the selector 35.

In a variant, the selector 35 can be disposed within the channel PLL 1, and the 1/n frequency divider 36 can be disposed outside the wobble PLL 20.

Figure 2:
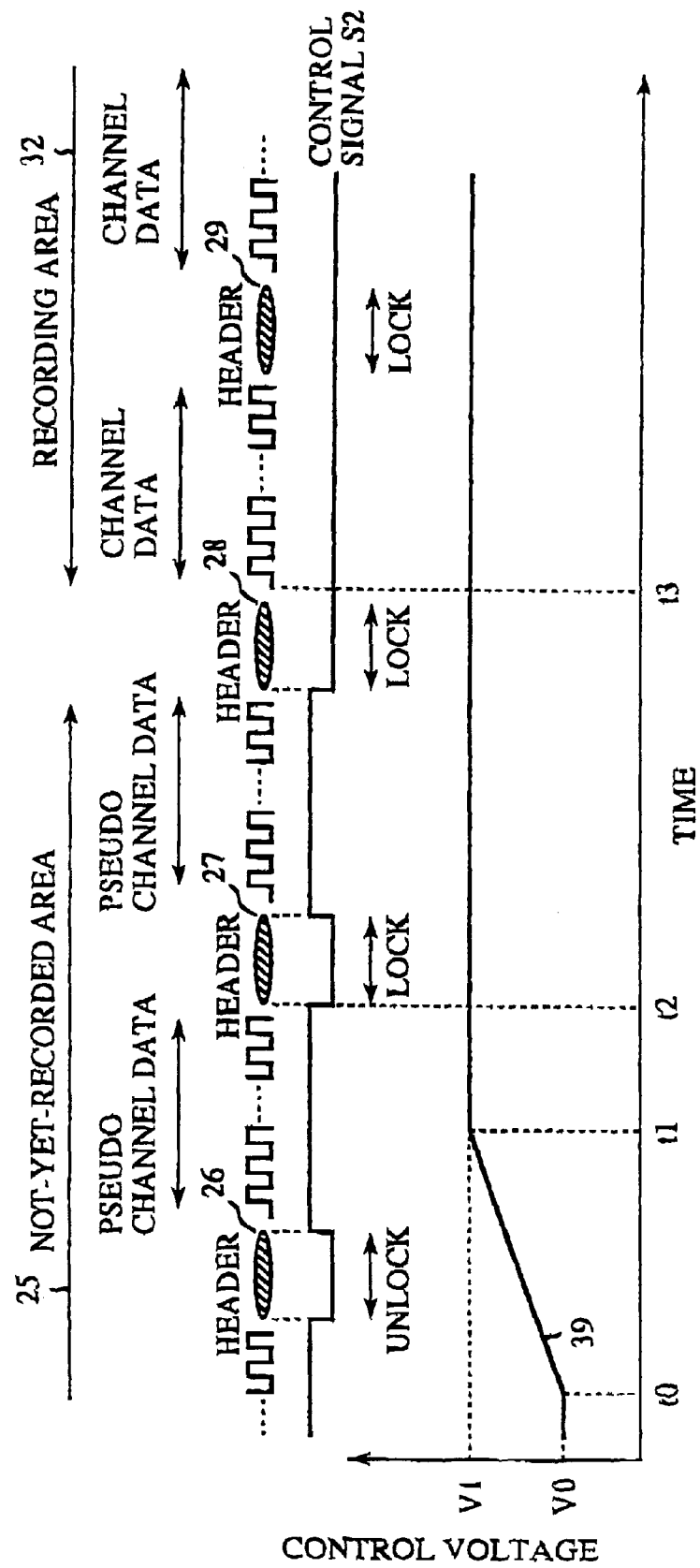
FIG. 2 is a timing diagram showing the operation of the optical disc device according to the first embodiment shown in FIG. 1.

Referring next to FIG. 2, there is illustrated a timing diagram showing the operation of the optical disc device according to the first embodiment shown in FIG. 1. In FIG. 2, it is assumed that the control voltage applied to the VCO 11 has an initial value V0 which differs from a locked voltage V1. When the locked voltage V1 is applied to the VCO 11, the VCO 11 generates a read clock signal RCK having a frequency suitable for locking the channel PLL 1 and then reproducing data properly.

If a control operation on the channel PLL 1 is started at time t0 in order to increase the control voltage having the initial value V0 to the locked voltage V1, the control signal S2 at a high logic level is applied to the selector 35 and the selector 35 selects the pseudo channel data D2 generated by the wobble PLL 20 since the target area on the optical disc that can be accessed by the optical disc device is an area within the not-yet-recorded area 25 between two header areas where no data is recorded. Consequently, the phase and frequency comparators 5 and 6 of the channel PLL 1 receive the pseudo channel data D2 from the selector 35.

The phase comparator 5 then compares the phase of the pseudo channel data D2 with that of the read clock signal RCK which is being furnished by the channel PLL 1 at that time. The phase comparator 5 consequently furnishes a phase error signal representing the phase displacement between the pseudo channel data D2 and the read clock signal RCK to the charge pump 7. Simultaneously, the frequency comparator 6 compares the frequency of the pseudo channel data D2 with that of the read clock signal RCK. The frequency comparator 6 then furnishes a frequency error signal representing the frequency displacement between the pseudo channel data D2 and the read clock signal RCK to the charge pump 8. The charge pump 7 increases the voltage of the phase error signal from the phase comparator 5 to a predetermined voltage so as to convert the phase error signal into a first current having an amplitude corresponding to the phase displacement between the pseudo channel data D2 and the read clock signal RCK and then deliver the first current to the adder 9. The charge pump 8 increases the voltage of the frequency error signal from the frequency comparator 6 to a predetermined voltage so as to convert the frequency error signal into a second current having an amplitude corresponding to the frequency displacement between the pseudo channel data D2 and the read clock signal RCK and then deliver the second current to the adder 9. The adder 9 obtains the sum of both the first and second currents from the charge pumps 7 and 8 and then delivers the summation result to the low-pass filter 10 as the summation error signal. The low-pass filter 10 generates an error voltage and then furnishes the error voltage as a control voltage to the VCO 11 by attenuating unnecessary high-frequency components of the summation error signal from the adder 9. The VCO 11 then generates a read clock signal RCK having a frequency corresponding to the control voltage from the low-pass filter 10. The read clock signal RCK is also fed back into both the phase and frequency comparators 5 and 6.

In the feedback loop, the control voltage applied to the VCO 11 increases as indicated by reference numeral 39 in FIG. 2, while the pseudo channel data D2 is applied to the channel PLL 1.

On the other hand, while the channel PLL 1 is in action as mentioned above, the frequency comparator 15 of the wobble PLL 20 compares the frequency of the wobble signal S1 with that of the output of the 1/186 frequency divider 19. The frequency comparator 15 then generates and furnishes a frequency error signal representing the frequency displacement between the wobble signal S1 and the output of the 1/186 frequency divider 19. The charge pump 16 increases the voltage of the frequency error signal from the frequency comparator 15 to a predetermined voltage so as to convert the frequency error signal into a current having an amplitude corresponding to the frequency displacement between the wobble signal S1 and the output of the 1/186 frequency divider 19 and then deliver the current to the low-pass filter 17. The low-pass filter 17 generates and furnishes an error voltage as a control voltage to the VCO 18 by attenuating unnecessary high-frequency components of the frequency error signal furnished by the charge pump 16. The VCO 18 then generates a write clock signal WCK having a frequency corresponding to the control voltage from the low-pass filter 17. The write clock signal WCK is also fed back into the frequency comparator 15 after the frequency of the write clock signal WCK is divided by the 1/186 frequency divider 19 by 186 so that the feedback signal obtained from the write clock signal WCK has the same frequency as the wobble signal S1.

When the optical disc device reaches the header area 26 shown in FIG. 2, the control signal S2 makes a HIGH to LOW transition, the control signal S2 at a low logic level is applied to the selector 35, and therefore the selector 35 selects the channel data D1 which is a header data prerecorded in the header area 26. The phase and frequency comparators 5 and 6 of the channel PLL 1 receive the channel data D1 from the selector 35. While the channel data D1 is applied to the channel PLL 1, the control voltage applied to the VCO 11 keeps rising as indicated by reference numeral 39 in FIG. 2, like the above case where the pseudo channel data D2 is applied to the channel PLL 1.

Furthermore, when the optical disc device passes through the header area 26 and then enters an area where no channel data is recorded, the control signal S2 makes a LOW to HIGH transition, the control signal S2 at a high logic level, and therefore the selector 35 selects the pseudo channel data D2. Consequently, while the pseudo channel data D2 is applied to the channel PLL 1, the control voltage applied to the VCO 11 keeps rising as indicated by reference numeral 39 in FIG. 2, like the above-mentioned cases.

At time t1 when the control voltage reaches a locked voltage V1 and the channel PLL 1 is then held in a locked state, the read clock signal RCK has a phase and a frequency corresponding to the control voltage held at the locked voltage V1. The optical disc device thus can start to read data recorded in the header area 29 at time t2 just when the optical disc device reaches the header area 27, and hence it can also start to reproduce data recorded in a data recording area 32, which is located just behind the header area 28, at time t3 when the optical disc device reaches the recording area 32.

Although the pseudo channel data D2 and each header data in the not-yet-recorded area 25 are discrete and out of phase with respect to each other when the control operation of this embodiment is performed, in the same way that the write clock WCK and header data are discrete and out of phase with respect to each other in the prior art optical disc device mentioned above, the channel PLL 1 can lock itself for a header area such as the header area 27 shown in FIG. 2 by only changing the phase of the read clock signal RCK by a slight amount, for example, when the optical disc device starts to read data recorded in the header area 27 as shown in FIG. 2 at time t2, because the channel PLL 1 has already locked itself for the pseudo channel data D2 at time t1.

As previously mentioned, the optical disk device according to the first embodiment of the present invention can control the channel PLL 1 using the pseudo channel data D2 and therefore the channel PLL 1 can lock itself quickly even when the optical disk device handles an area on an optical disc where no data is recorded, such as an area between two adjacent header areas in the not-yet-recorded area 25 as shown in FIG. 2. Accordingly, the first embodiment offers an advantage of being able to reduce the time required for bringing the optical disc device to a state in which it can read header data or channel data.

Second Embodiment

Figure 3:
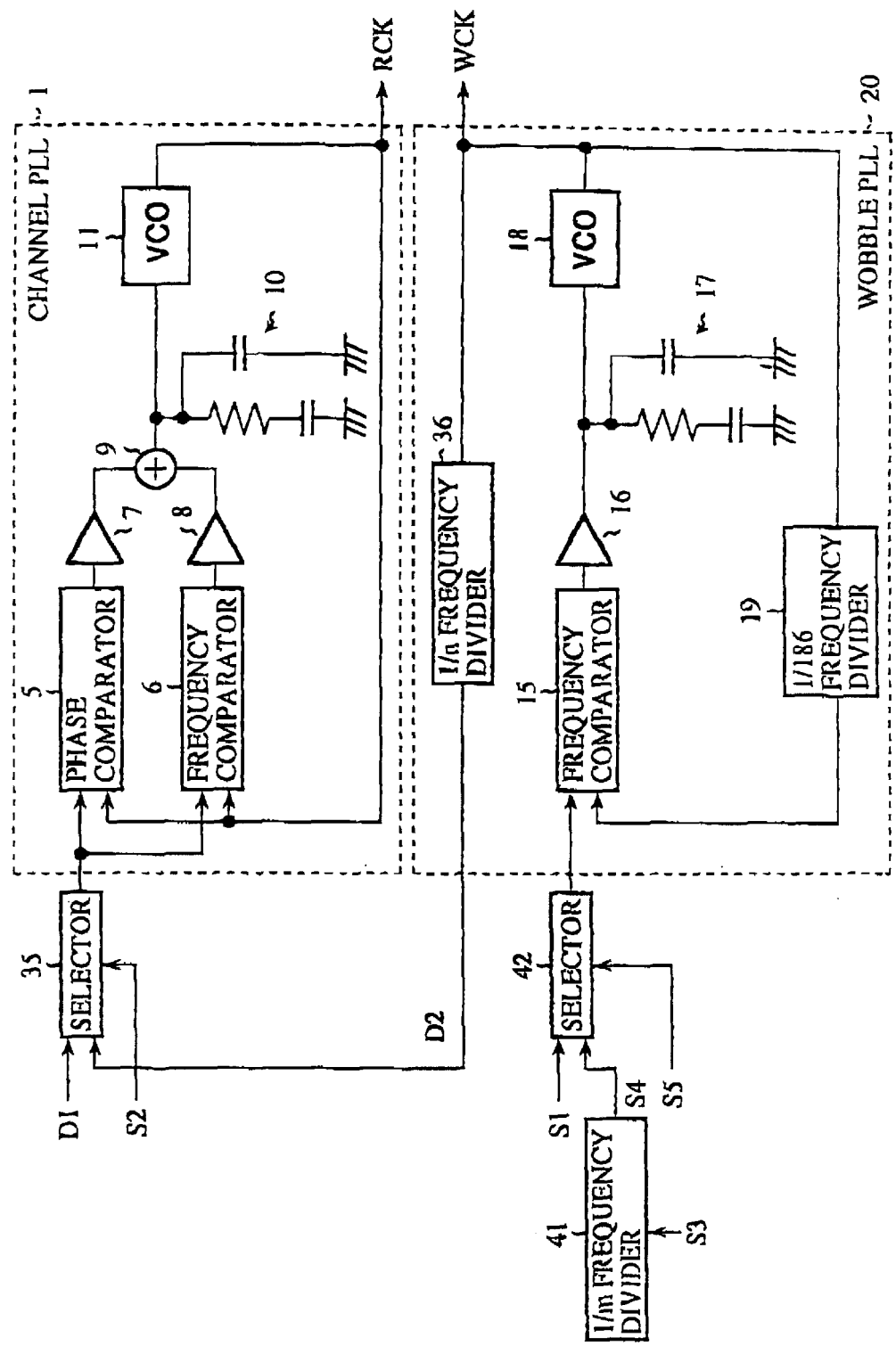
FIG. 3 is a block diagram showing the structure of an optical disc device according to a second embodiment of the present invention.

Referring next to FIG. 3, there is illustrated a block diagram showing the structure of an optical disc device according to a second embodiment of the present invention. In the figure, the same components as the optical disc device according to the first embodiment shown in FIG. 1 are designated by the same reference numerals, and therefore the description of the same components will be omitted hereinafter.

In FIG. 3, reference numeral 41 denotes a 1/m frequency divider which can divide the frequency of a signal S3 furnished by a crystal oscillator not shown by m so as to generate a pseudo wobble signal S4 having the same frequency as the wobble signal S1 that can be provided when the optical disc rotates with stability, and then furnish the pseudo wobble signal S4 to a selector 42 which can select either the wobble signal S1 or the pseudo wobble signal S4 according to the level of a control signal S5 applied thereto. When the wobble signal S1 does not have a normal value, for example, when a servo-mechanism (not shown) fails to perform tracking, that is, when something is wrong with tracking of the optical disc, the control signal S5 goes low. On the other hand, when the wobble signal S1 has a normal value, for example, when a servo-mechanism (not shown) performs tracking normally, the control signal S5 goes high. When the control signal S5 at a low logic level is applied to the selector 42, the selector 42 selects and furnishes the pseudo wobble signal S4 from the 1/m frequency divider 41 to the frequency comparator 15. When the control signal S5 at a high logic level is applied to the selector 42, the selector 42 selects and furnishes the wobble signal S1 to the frequency comparator 15.

In an alternative arrangement, the 1/m frequency divider 41 and the selector 42 can be disposed within the wobble PLL 20.

Figure 4:
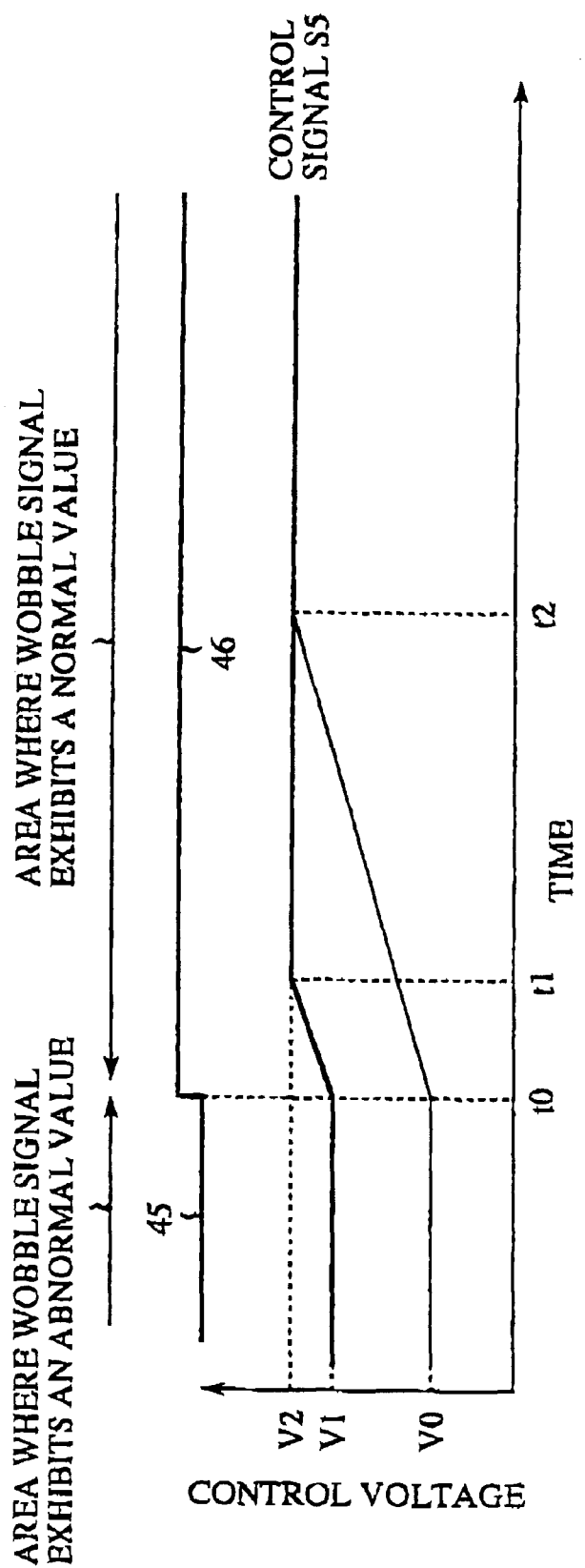
FIG. 4 is a timing diagram showing the operation of the optical disc device according to the second embodiment shown in FIG. 3.

Referring next to FIG. 4, there is illustrated a timing diagram showing the operation of the optical disc device according to the second embodiment of the present invention. When an event that causes the wobble signal S1 to exhibit an abnormal value occurs before time t0, as shown in FIG. 4, the control signal S5 makes a HIGH to LOW transition as indicated by reference numeral 45. The selector 42 then selects and furnishes the pseudo wobble signal S4 to the frequency comparator 15. As a result, in the wobble PLL 20, the control voltage applied to the VCO 18 is set to and is held at a voltage V1 which is close to the locked voltage V2 which is the target control voltage.

After that, when the wobble signal S1 exhibits a normal value after the time t0, the control signal S5 makes a LOW to HIGH transition as indicated by reference numeral 46. The selector 42 then selects and furnishes the wobble signal S1 to the frequency comparator 15. As a result, the wobble PLL 2 locks itself with the locked voltage V1 corresponding to the wobble signal S1 at time t1.

If the wobble PLL 20 does not use the pseudo wobble signal S4 when the wobble signal has an abnormal value, the wobble PLL 20 is brought to a free-running state in which it cannot be controlled. In the free-running state, the control voltage applied to the VCO 18 may deviate largely from the locked voltage V2 that can be generated when the wobble signal S1 having a normal value is applied to the wobble PLL 20. For example, the control voltage can be held at a voltage V0 as shown in FIG. 4. In this case, if the loop gain of the wobble PLL 20 is constant, the control voltage applied to the VCO 18 increases to the locked voltage V2 at the same rate, as shown in FIG. 4, so that the time when the control voltage having the initial value V0 reaches the locked voltage V2 is the time t2. Thus there exists a large delay in locking the control voltage as compared with the case of using the pseudo wobble signal S4 as mentioned above. In other words, the use of the pseudo wobble signal S4 makes it possible to reduce the time required for locking the control voltage by a large amount as compared with the case where the pseudo wobble signal S4 is not used.

As previously mentioned, even when the wobble signal S1 does not exhibit a normal value, the optical disc device according to the second embodiment of the present invention can make the wobble PLL 20 and the channel PLL 1 lock itself using the pseudo wobble signal S4 in the same way the wobble signal S1 has a normal value. Accordingly, the wobble PLL 20 can make a transition to its locked state quickly as well as the channel PLL 1 after the optical disc device enters an area where the wobble signal S1 exhibits a normal value.

Third Embodiment

Figure 5:
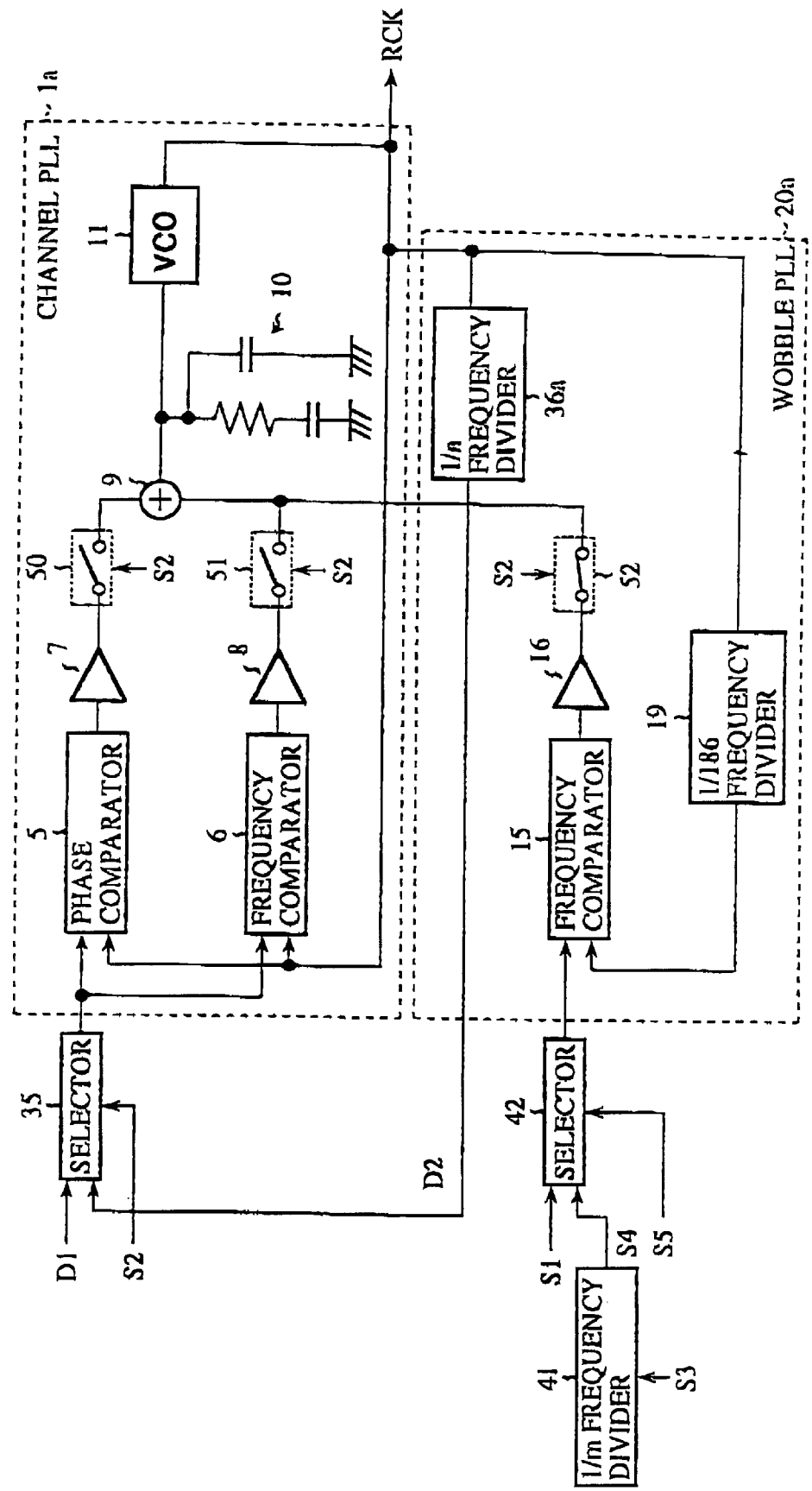
FIG. 5 is a block diagram showing the structure of an optical disc device according to a third embodiment of the present invention.

Referring next to FIG. 5, there is illustrated a block diagram showing the structure of an optical disc device according to a third embodiment of the present invention. In the figure, the same components as the optical disc device according to the second embodiment shown in FIG. 3 are designated by the same reference numerals, and therefore the description about the same components will be omitted hereinafter.

In FIG. 5, reference numeral 1a denotes a channel PLL circuit which can generate a read clock signal RCK from either a channel data D1 or a pseudo channel data D2 having the same frequency as the channel data D1 which is furnished by a wobble PLL 20a. The wobble PLL 20a of the third embodiment reproduces a pseudo channel data D2 from either the wobble signal S1 or the pseudo wobble signal S4.

Reference numeral 50 denotes a first switch disposed within the channel PLL 1a, which can be turned off when the control signal S2 at a high logic level is applied thereto, and turned on so as to furnish the current from the charge pump 7 representing the phase displacement between the channel data D1 and the read clock signal RCK to the adder 9 when the control signal S2 at a low logic level is applied thereto; and 51 denotes a second switch disposed within the channel PLL 1a, which can be turned off when the control signal S2 at a high logic level is applied thereto, and turned on so as to furnish the current from the charge pump 8 representing the frequency displacement between the channel data D1 and the read clock signal RCK to the adder 9 when the control signal S2 at a low logic level is applied thereto.

Furthermore, reference numeral 52 denotes a third switch disposed in the wobble PLL 20a, which can be turned off when the control signal S2 at a low logic level is applied thereto, and turned on so as to furnish the current showing the frequency displacement between the output of the selector 42 and the output of the 1/186 frequency divider 19 to the adder 9 when the control signal S2 at a high logic level is applied thereto; and 36a denotes a 1/n frequency divider which can generate and furnish a pseudo channel data D2 to the selector 35 by dividing the frequency of the read clock signal RCK from the channel PLL 1a by n.

The optical disc device according to the third embodiment of the present invention is characterized in that the provision of the plurality of switches 50 through 52 makes it possible to eliminate the VCO from the wobble PLL 20a, and therefore only one VCO is disposed in the optical disc device. In an alternative arrangement, the 1/m frequency divider 41 and the selector 42 can be eliminated, like the first embodiment mentioned above.

Figure 6:
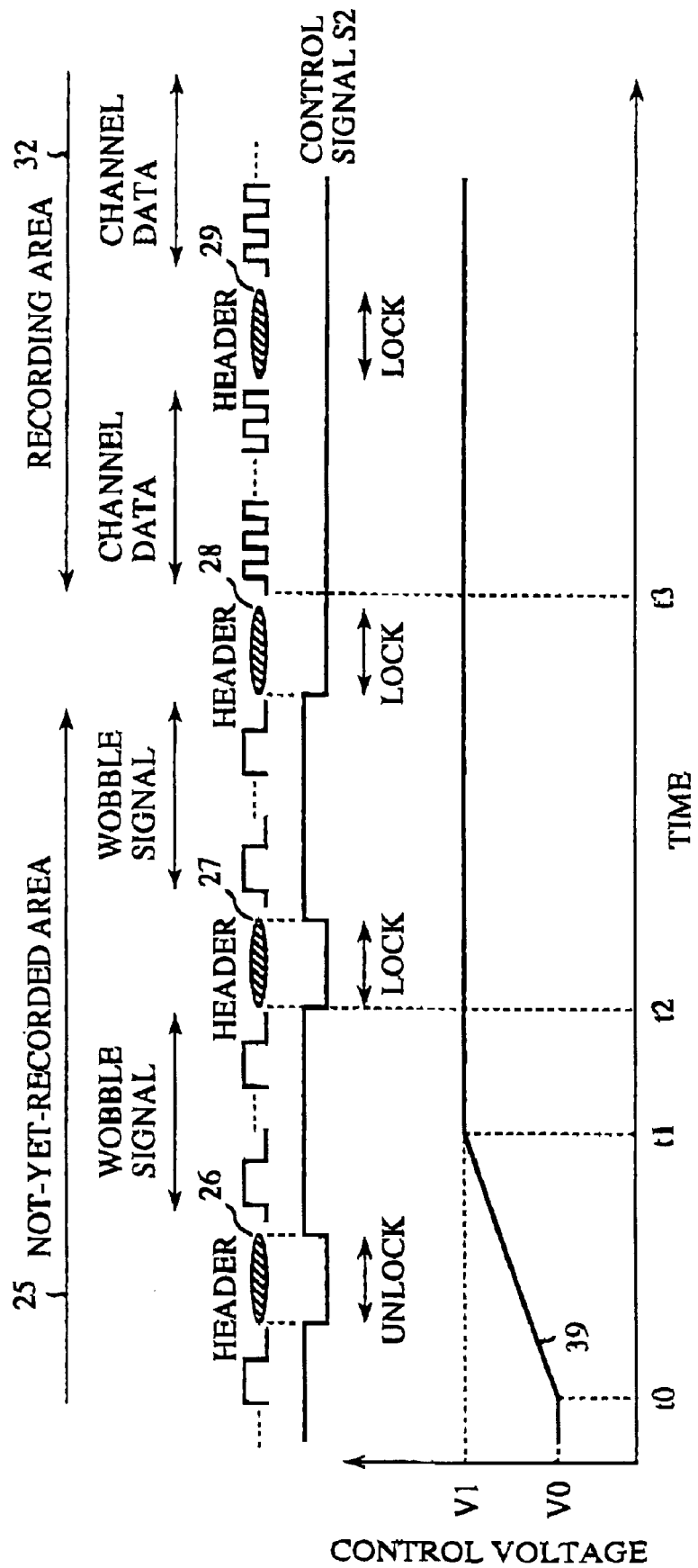
FIG. 6 is a timing diagram showing the operation of the optical disc device according to the third embodiment shown in FIG. 5.
Figure 7:
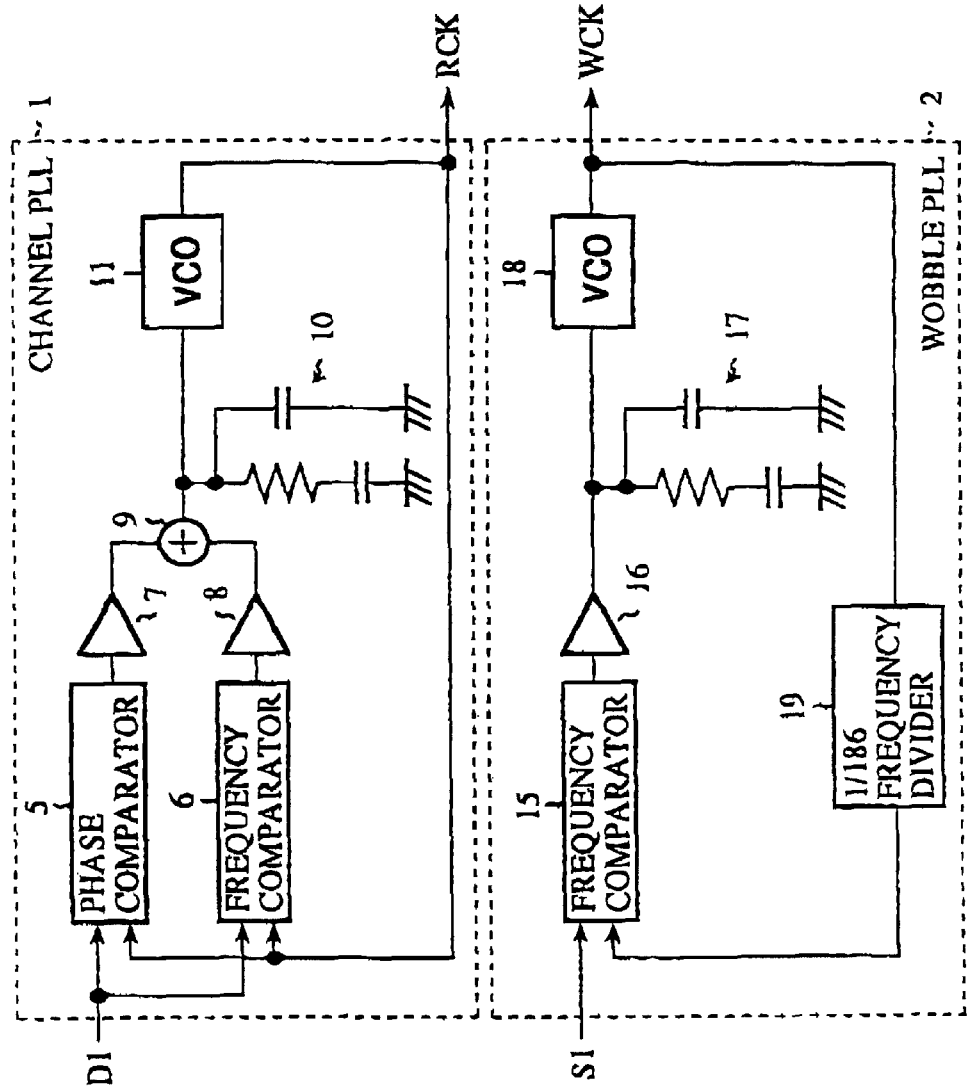
FIG. 7 is a block diagram showing the structure of a prior art optical disc device.
Figure 8:
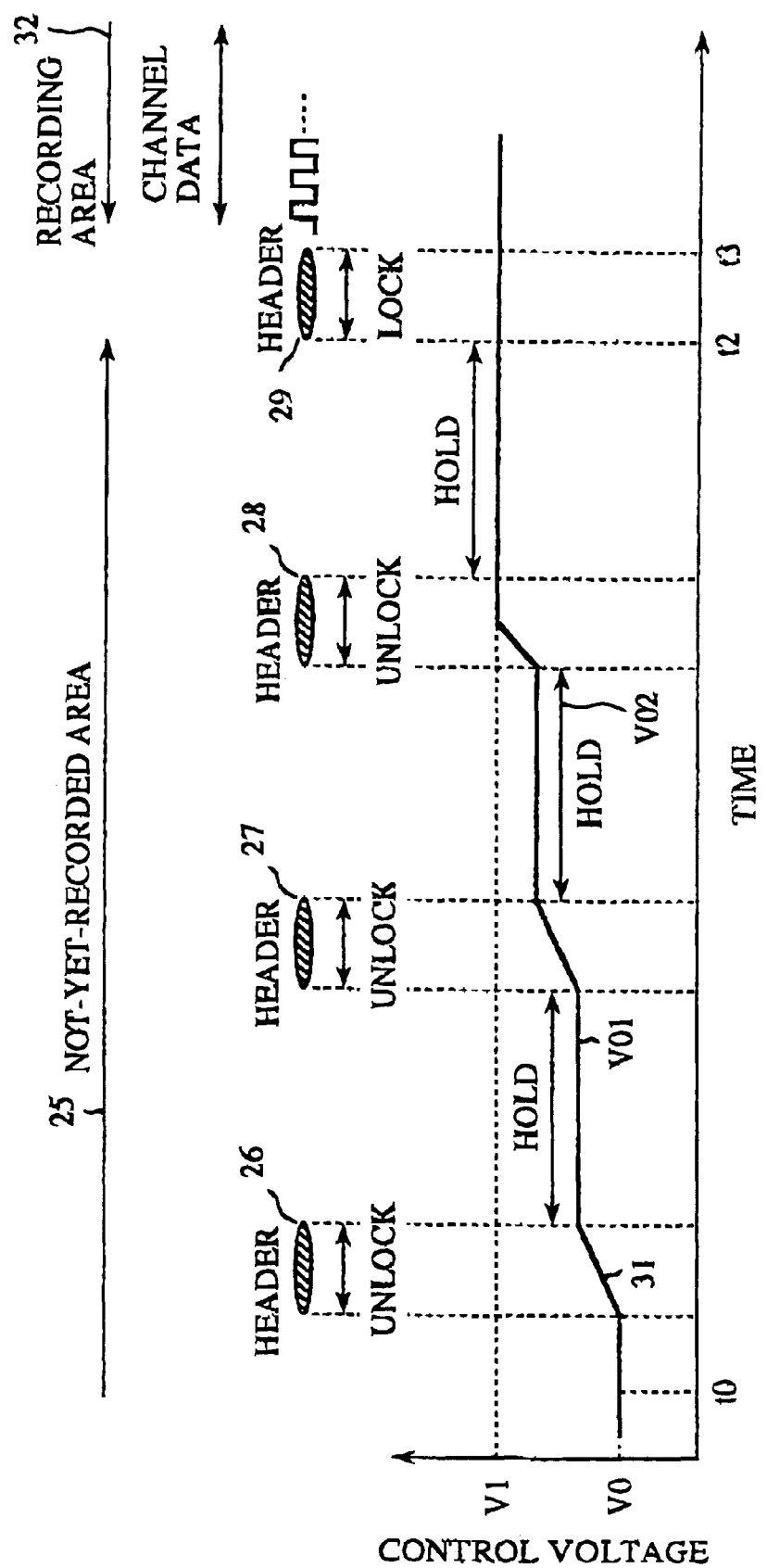
FIG. 8 is a timing diagram showing the operation of the prior art optical disc device shown in FIG. 7.

Referring next to FIG. 6, there is illustrated a timing diagram showing the operation of the optical disc device according to the third embodiment of the present invention. In FIG. 6, it is assumed that the control voltage applied to the VCO 11 has an initial value V0 that differs from a locked voltage V1, and a control operation is performed on the channel PLL 1a at time t0.

In the example shown in FIG. 6, since the optical disc device is handling a not-yet-recorded area 25 when the control operation is started, the selector 35 selects the pseudo channel data D2 generated by the wobble PLL 20a in response to the control signal S2 at a high logic level. Simultaneously, the control signal S2 at a high logic level is also applied to the plurality of switches 50 through 52. Both the switches 50 and 51 are thus turned off and the switch 52 is turned on. As a result, only the current from the charge pump 16 representing the frequency displacement between the output signals from the selector 42 and the 1/186 frequency divider 19 is applied to the low-pass filter 10 by way of the adder 9. The low-pass filter 10 converts the current from the charge pump 16 into a control voltage and then furnishes the control voltage to the VCO 11.

That is, while the optical disc device handles the not-yet-recorded area 25 as shown in FIG. 6, the optical disc device can control the channel PLL 1a so that the channel PLL 1a generates a read clock signal RCK having a frequency which is close to the frequency at which the channel data or header data is transferred, by making the VCO 11 of the channel PLL 1a operate in synchronism with the wobble signal S1.

After that, when the optical disc device enters the header area 26 shown in FIG. 6, the control signal S2 makes a HIGH to LOW transition. When the control signal S2 at a low logic level is applied to the selector 35, the selector 35 selects the channel data D1 which is a data pre-recorded in the header area 26. Simultaneously, the control signal S2 at a low logic level is also applied to the plurality of switches 50 through 52. As a result, both the switches 50 and 51 are turned on and the switch 52 is turned off. The adder 9 then sums the first current from the charge pump 7 representing the phase displacement between the channel data D1 and the read clock signal RCK and the second current from the charge pump 8 representing the frequency displacement between the channel data D1 and the read clock signal RCK. The low-pass filter 10 converts the summation result into a control voltage and then furnishes the control voltage to the VCO 11. The same control operation is carried out even when the optical disc device enters a recording area 32 between two adjacent header areas where channel data are recorded.

Thus, in either one of header areas and recording areas, such as the recording area 32, the optical disc device can control the channel PLL 1a so that the channel PLL 1a generates a read clock signal RCK having a frequency which is close to the target frequency for channel data or header data, by making the VCO 11 of the channel PLL 1a operate in synchronism with the channel data D1.

As previously explained, the read-only optical disc device according to the third embodiment of the present invention is so constructed as to generate the read clock signal RCK using only one VCO, while the optical disc device according to the first or second embodiment needs two VCOs. Accordingly, since the read-only optical disc device can eliminate one VCO which is larger than other circuit components in size and consumes greater power than the other circuit components, and which is a noise source, the size of the whole of the optical disc device can be reduced, the power consumption can be reduced, and the noise generated by the optical disc device can be reduced.

Numerous variants may be made in the exemplary embodiments mentioned above. Preferably, the dividing ratio n of the 1/n frequency divider 36 of either one of the first and second embodiments shown in FIGS. 1 and 3 can be defined in such a manner that the frequency divider 36 divides the frequency of the write clock signal WCK by n so as to generate a pseudo channel data D2 having a frequency that is almost equal to the average frequency of the channel data D1. It is also apparent that the dividing ratio n of the 1/n frequency divider 36a of the third embodiment shown in FIG. 5 can be defined in such a manner that the frequency divider 36a divides the frequency of the read clock signal RCK by n so as to generate a pseudo channel data D2 having a frequency that is almost equal to the average frequency of the channel data D1.

In general, a phase comparator disposed within the PLLs can be activated on every rising edge of input data. Therefore, when the current capacity of a charge pump located in a later stage or the circuit constant of a low-path pass filter located in a later stage is fixed, the gain of the PLL increases with the frequency of data input to the phase comparator, that is, the gain of the PLL increases with the number of edges of the input data. In other words, the gain of the PLL decreases with decreases in the frequency of the input data, that is, the gain of the PLL decreases with decreases in the number of edges of the input data. Accordingly, there is a possibility that the loop gain of the channel PLL 1 becomes unstable when the frequency of the pseudo channel data D2 is different from an average frequency of channel data D1 which can be read out of the optical disc. The 1/n frequency divider 36 of the variant mentioned above makes it possible to stabilize the loop gain of the channel PLL 1 by dividing the frequency of the write clock signal WCK by n so as to generate pseudo channel data D2 having a frequency that is almost equal to the average frequency of channel data D1. Similarly, the 1/n frequency divider 36a of the variant mentioned above makes it possible to stabilize the loop gain of the channel PLL 1 by dividing the frequency of the read clock signal RCK by n so as to generate a pseudo channel data D2 having a frequency that is almost equal to the average frequency of channel data D1.

Alternatively, when switching between the pseudo channel data D2 and the channel data D1, it is possible to adjust the circuit constants of the charge pumps 7 and 8, and/or adjust the circuit constant of the low-pass filter 10 so that the loop gain of the channel PLL 1 is optimized. However, this alternative has a disadvantage that the size of the optical disc device is greater than those of the other alternative mentioned above in which the dividing ratios of the frequency dividers 36 and 36a are defined so as to stabilize the loop gain of the channel PLL 1.

In another alternative, the dividing ratio n of the 1/n frequency divider 36 of either one of the first and second embodiments shown in FIGS. 1 and 3 can be defined in such a manner that the frequency divider divides the frequency of the write clock signal WCK by n so as to generate a pseudo channel data D2 having a frequency showing a regularity which is nearly the same as that shown by the frequency of channel data 1 that varies with time. In other words, the dividing ratio n is determined such that the pseudo channel data D2 has a frequency which is close to an average frequency of the channel data D1 having a plurality of frequency components. The average frequency of the channel data D1 can be predetermined by experiment. It is also apparent that the dividing ratio n of the 1/n frequency divider 36a of the third embodiment shown in FIG. 5 can be defined in such a manner that the frequency divider divides the frequency of the read clock signal RCK by n so as to generate a pseudo channel data D2 having a frequency showing a regularity which is nearly the same as that shown by the frequency of channel data 1 that varies with time.

The frequency comparator 6 disposed within the channel PLL 1 measures what frequency the output clock (i.e., write clock WCK) from the VCO 11 has with respect to the input data (i.e., channel data D1 or the pseudo channel data D2). That is, the frequency comparator 6 measures how many edges of the output clock from the VCO 11 that exist between any two adjacent edges of the input data.

On the other hand, since the output clock from the VCO 11 does not have an adequately large frequency as compared with the channel data D1, there is a dead zone in which the frequency comparator 6 cannot operate with the frequency of the channel data D1 which is less than or equal to the resolution of the output clock. Therefore, when the pseudo channel data D2 is generated by dividing the frequency of the signal or write clock signal WCK obtained by frequency multiplication of the wobble signal S1 by the dividing ratio n by means of the 1/n frequency divider 36, the frequency of the channel PLL 1 which goes into action in response to the pseudo channel data D2 falls in the dead zone of the frequency comparator 6, and therefore there is a possibility that the channel PLL 1 locks itself temporarily to generate a read clock signal RCK having a frequency slightly deviating from a desired frequency to be locked. Since the difference between the temporarily locked frequency and the desired frequency to be locked is relatively small, any one of the first through third embodiments can offer the aforementioned advantages without any measures directed toward the prevention of such a temporary or pseudo locking. However, it takes a longer time to make the channel PLL 1 lock itself since the frequency comparator 6 is activated when the channel PLL 1 performs its locking operation on header data or channel data applied to thereto.

The alternative mentioned above can prevent the generation of temporary or pseudo locking and hence reduce the time required for making the channel PLL 1 lock itself by dividing the frequency of the write clock signal WCK or the read clock signal RCK by n so as to generate a pseudo channel data D2 having a frequency showing a regularity which is nearly the same as that shown by the frequency of channel data D1 that varies with time, as mentioned above. Alternatively, a method of applying a noise to the input of the VCO 11 can be provided as a measure to prevent the generation of temporary or pseudo locking.

As previously explained, the present invention offers the following advantages.

The channel PLL of the optical disc device according to the present invention can lock itself quickly when the optical disc device handles a not-yet-recorded area on an optical disc where no data is recorded. Accordingly, the present invention can reduce the time required for bringing the optical disc device to a state in which it can read header data or channel data.

Furthermore, the present invention provides the advantage of being able to make the wobble PLL and the channel PLL lock themselves quickly when the wobble signal exhibits a normal value.

In accordance with a preferred embodiment of the present invention, there is provided a read-only optical disc device which can eliminate one VCO which is larger than other circuit components in size and consumes greater power than the other circuit components, and which is a noise source. Accordingly, the size of the whole of the optical disc device can be reduced, the power consumption can be reduced, and the noise generated by the optical disc device can be reduced.

Furthermore, the present invention offers the advantage of being able to stabilize the loop gain of the channel PLL.

In addition, the present invention offers the advantage of being able to prevent the generation of temporary or pseudo locking in the channel PLL and reduce the time required for making the channel PLL lock itself.

Furthermore, in accordance with another preferred embodiment of the present invention, the dividing ratio of a frequency divider for generating a pseudo channel data is defined in such a manner that the pseudo channel data has a frequency showing a regularity which is nearly the same as that shown by the frequency of channel data that varies with time. Accordingly, the present invention offers the advantage of being able to make the channel PLL lock itself quickly.

Many widely different embodiments of the present invention may be constructed without departing from the spirit and scope of the present invention. It should be understood that the present invention is not limited to the specific embodiments described in the specification, except as defined in the appended claims.

What is claimed is:

1. An optical disc device for reading data from and writing data to an optical disc using light, the device comprising:

first selecting means for selecting, as input data, at least one of: header data recorded in a header area on an optical disc and channel data recorded in a data recording area between two adjacent header areas on the optical disc when said optical disc device processes at least one of the header area and the data recording area, and for selecting pseudo input data when said optical disc device processes a not-yet-recorded area between two adjacent header areas on the optical disc where no data is recorded;

channel phase-locked loop means for generating a phase error signal representing a phase displacement between at least one of: the input data and the pseudo input data selected by said first selecting means and a feedback signal, for generating a frequency error signal representing a frequency displacement between at least one of: the input data and the pseudo input data selected by said first selecting means and the feedback signal, for increasing a sum of voltages of the phase and frequency error signals to generate a read clock signal having a frequency corresponding to the increased voltages for reading data from the optical disc, and for feeding back the read clock signal as the feedback signal for generating the phase and frequency error signals;

wobble phase-locked loop means for generating a phase error signal representing a phase displacement between a wobble signal obtained from the optical disc and the feedback signal, for increasing a voltage of the phase error signal to generate a write clock signal having a frequency corresponding to the increased voltage for writing data to the optical disc, and for dividing a frequency of the write clock signal to generate and feed back the feedback signal having the same frequency as the wobble signal for generating the phase error signal; and first frequency dividing means for dividing the frequency of the write clock signal from said wobble phase-locked loop means by a number n to generate and furnish the pseudo input data to said first selecting means.

2. The optical disc device according to claim 1, comprising second frequency dividing means for dividing a frequency of a signal from a crystal oscillator to generate a pseudo wobble signal having the same frequency as the wobble signal, and second selecting means for selecting and furnishing the pseudo wobble signal from said second frequency dividing means to said wobble phase-locked loop means when the wobble signal cannot be applied to said optical disc device.

3. The optical disc device according to claim 2, wherein said second selecting means selects and furnishes the pseudo wobble signal from said second frequency dividing means to said wobble phase-locked loop means in response to a control signal indicating an error in tracking of the optical disc.

4. The optical disc device according to claim 1, wherein said first frequency dividing means divides the frequency of the write clock signal from said wobble phase-locked loop means by the number n to generate the pseudo input data having a frequency approximately equal to an average frequency of the input data.

5. The optical disc device according to claim 1, wherein said first frequency dividing means divides the frequency of the write clock signal from said wobble phase-locked loop means by the number n to generate the pseudo input data having a frequency showing a regularity nearly the same as a regularity of a frequency of channel data that varies with time.

6. An optical disc device for reading data from an optical disc using light, the device comprising:

first selecting means for selecting, as input data, at least one of: header data stored in a header area on an optical disc and channel data stored in a data recording area between two adjacent header areas on the optical disc when said optical disc device processes at least one of the header area and the data recording area, and for selecting pseudo input data when said optical disc device processes a not-yet-recorded area between two adjacent header areas on the optical disc where no data is recorded;

channel phase-locked loop means for generating a phase error signal representing a phase displacement between at least one of: the input data and the pseudo input data selected by said first selecting means and a feedback signal, for generating a frequency error signal representing a frequency displacement between at least one of: the input data and the pseudo input data selected by said first selecting means and the feedback signal, for increasing a sum of voltages of the phase and frequency error signals to a first error voltage to generate a read clock signal having a frequency corresponding to the first error voltage for reading data from the optical disc when the optical disc device processes at least one of the header area and the data recording area, and for generating a read clock signal having a frequency corresponding to a voltage of a second error voltage applied thereto when said optical disc device processes the not-yet-recorded area, and for feeding back the read clock signal as the feedback signal for generation of the phase and frequency error signals;

wobble phase-locked loop means for generating a phase error signal representing a phase displacement between a wobble signal obtained from the optical disc and a feedback signal, for increasing the voltage of the phase error signal to generate and furnish the second error voltage to said channel phase-locked loop means only when said optical disc device processes at least one of: the header area and the data recording area, and for dividing a frequency of the read clock signal from said channel phase-locked loop means to generate and feed back the feedback signal having the same frequency as the wobble signal for generating the phase error signal; and first frequency dividing means for dividing the frequency of the read clock signal from said channel phase-locked loop means by a number n to generate and furnish the pseudo input data to said first selecting means.

7. The optical disc device according to claim 6, comprising second frequency dividing means for dividing a frequency of a signal from a crystal oscillator to generate a pseudo wobble signal having the same frequency as the wobble signal, and second selecting means for selecting and furnishing the pseudo wobble signal from said second frequency dividing means to said wobble phase-locked loop means when the wobble signal cannot be applied to said optical disc device.

8. The optical disc device according to claim 7, wherein said second selecting means selects and furnishes the pseudo wobble signal from said second frequency dividing means to said wobble phase-locked loop means in response to a control signal indicating an error in tracking of the optical disc.

9. The optical disc device according to claim 6, wherein said first frequency dividing means divides the frequency of the read clock signal from said channel phase-locked loop means by the number n to generate the pseudo input data having a frequency approximately equal to an average frequency of the input data.

10. The optical disc device according to claim 6, wherein said first frequency dividing means divides the frequency of the read clock signal from said channel phase-locked loop means by the number n to generate the pseudo input data having a frequency showing a regularity approximately equal to a regularity of the frequency of channel data that varies with time.

* * * * *